United States Patent [19]

Liao

[11] Patent Number: 4,494,151
[45] Date of Patent: Jan. 15, 1985

[54] 4-PIXEL RUN-LENGTH CODE FOR DATA COMPRESSION

[75] Inventor: Henry H. Liao, Rossmore, Calif.

[73] Assignee: Xerox Corporation, Stamford, Conn.

[21] Appl. No.: 347,203

[22] Filed: Feb. 9, 1982

Related U.S. Application Data

[63] Continuation of Ser. No. 54,389, Jul. 2, 1979, abandoned, and Ser. No. 150,780, May 19, 1980, abandoned.

[51] Int. Cl.³ .............................................. H04N 7/12
[52] U.S. Cl. .............................. 358/261; 340/347 DD
[58] Field of Search ............... 340/347 DD; 358/260, 358/261, 133

[56] References Cited

U.S. PATENT DOCUMENTS

3,588,329  6/1971  Monk .................................. 358/260
4,057,834  11/1977 Nakagome et al. ............ 358/261 X
4,060,834  11/1977 Mounts et al. ...................... 358/261
4,092,676  5/1978  Saran ................................... 358/261

Primary Examiner—T. J. Sloyan
Attorney, Agent, or Firm—Robert E. Cunha

[57] ABSTRACT

A circuit to encode image data. The circuit receives image data in four bit nibbles which are either all-zero nibbles or terminating nibbles containing at least one non-zero bit. The circuit output is a series of code words, each a multiple of four bits and up to twenty-four bits long, packed into eight bit output words. Each code word contains a first part containing a run length specifying the number of received all-zero nibbles and a second part specifying the bit pattern of the terminating nibble. The circuit uses PROMs for the look-up and control elements and a pipeline of registers to allow high speed operation.

20 Claims, 14 Drawing Figures

| CODE TYPE | | ASSIGNMENT |
|---|---|---|
| TYPE 1 | `10 # #`<br>X∈A, Y = 0 | # # = 00 → X = 1000<br>= 01 → = 0100<br>= 10 → = 0010<br>= 11 → = 0001 |
| TYPE 2<br>2A | `000000 # #`<br>CONTROL CODES | # # = 00 → RAW (RAW IMAGE DATA)<br>= 01 → NOL (NORMAL END OF LINE)<br>= 10 → PBK (PREDICTION BREAK)<br>= 11 → RPT (REPEAT PREVIOUS LINE)<br>01110000 → OPTIONAL SOP (START OF PAGE)<br>01110001 → OPTIONAL EOP (END OF PAGE) |
| 2B | `0nnnnn # #`<br>X A<br>1≤Y≤25 | # # = 00 → X = 1000<br>= 01 → = 0100<br>= 10 → = 0010<br>= 11 → = 0001 |
| 2C | `011bbbbz`<br>X∈B<br>Y = 0,1 | nnnnn → 5 BITS REPRESENTATION OF Y<br>z = 0 → Y = 0, z = 1 → Y = 1<br>bbbb = EXACT BIT PATTERN OF CLASS B<br>TERMINATOR EXCEPT THE FOLLOWING<br>X = 0011* → bbbb = 0100 |
| TYPE 3 | `11nnnnnnbbbb` | bbbb = CLASS A OR CLASS B TERMINATOR |
| 3A1<br>3A2 | X∈A, 26≤Y≤63<br>X∈B, 2≤Y≤63 | nnnnnn = BINARY REPRESENTATION OF Y |
| 3B | `11nnnnnn0000`<br>64×N, 1≤N≤63 | nnnnnn = MULTIPLE OF 64 ZERO NIBBLES |

| CONDITIONS | | | CODE | TYPE |
|---|---|---|---|---|
| 5 MSB ZERO | X∈A | Y = 0 | | 1 |
| | | 1 ≤ Y ≤ 25 | | 2B |
| | | 26 ≤ Y ≤ 63 | | 3A1 |
| | X∈B | Y = 0 OR 1 | | 2C |
| | | 2 ≤ Y ≤ 63 | | 3A2 |
| MSB NOT ZERO | X∈A | Y = 0 | | 3B, 1 |
| | | 1 ≤ Y ≤ 25 | | 3B, 2B |
| | | 26 ≤ Y ≤ 63 | | 3B, 3A1 |
| | X∈B | Y = 0 OR 1 | | 3B, 2C |
| | | 2 ≤ Y ≤ 63 | | 3B, 3A2 |

4-PIXEL RUN-LENGTH CODE FOR DATA COMPRESSION

BACKGROUND OF THE INVENTION

This is a continuation of copending Patent Application, "A 4-Pixel Run-Length Code for Data Compression", Ser. No. 054,389, filed on July 2, 1979 now abandoned and Ser. No. 150,780, filed May 19, 1980 now abandoned.

This invention relates to the compression of binary data and more particularly to an improved run-length coding circuit.

There is a need in electronic systems for compacting data so that the information contained within said data may be stored in less memory space or transmitted at a higher rate.

One technique is the use of a simple run-length code where the number of bits is transmitted rather than the bits themselves. In other words, the number "64" would be transmitted instead of the 64 bits.

A predictor may be used before the run-length encoder to increase the compression. A predictor examines the previous bits and then predicts the state of the instant bit. The prediction and the instant bit are then compared, a successful prediction being coded as a "0" bit, an unsuccessful prediction being coded as a "1" bit. A well designed predictor increases the average run length and therefore, improves the efficiency of the encoder. In the system described herein a predictor is used ahead of the encoder but the claims are directed to the encoder alone since the encoder may be used with or without the predictor in any actual transmission or recording system.

A problem with a simple run-length encoder is that it must process each input bit as it is received. For example, after the reception of a string of 0s, the next bit must be inspected. If it is a 0, a run-length counter is incremented; if it is a one, the previous counter total is transmitted and the counter is initialized.

To speed up the data rate, the run-length encoder may be designed to process data bits in parallel. One example of this technique is described by John Monk in U.S. Pat. No. 3,588,329. The input bits are inspected in blocks of 64, 16, or 4 bits at a time and a variable length output word is produced containing the compressed data in the form of modified run-lengths.

The parallel processing of data in the form of data blocks increases the data rate, but ultimately a limit is reached based on the number of bits per block, which must be optimized for the particular application, and the circuit complexity, which must be minimized. An example of a commercially useful encoder is one that can operate in excess of 50M bits per second in the compression of image data.

SUMMARY OF THE INVENTION

The circuit described herein receives the output of a predictor in the form of four-bit nibbles, and produces an encoded and compressed output which is formatted into four, eight or twelve bits per word.

Because the data is first processed by a predictor, there is an increased likelihood of the encoder input comprising long strings of 0s. The encoder maximizes the compression of these strings by grouping the input data into data words compromising an uninterrupted line of nibbles containing all 0s, regardless of how many that may be, followed by a terminating nibble having at least one 1 bit. A first code word portion is assigned to the number of all-zero nibbles, and a second code word portion is assigned to the data pattern of the terminating nibble. The final code word is the combination of the first and second code word portions.

The circuit used to generate this composite code is capable of high data rates for two reasons. First, the input data is always received as a multiple of 4 bits and the output code words are always formed as four, eight or twelve bit words so that both input and output words may be processed and transmitted in words of four parallel bits. Second, the encoding process is a table look-up, resulting in a simple circuit and a high data rate.

The object of the invention, therefore, is to provide a modified run-length encoding circuit which allows the efficient encoding/decoding of binary data at high data rates.

DETAILED DESCRIPTION OF THE DRAWINGS

Figure 1A:
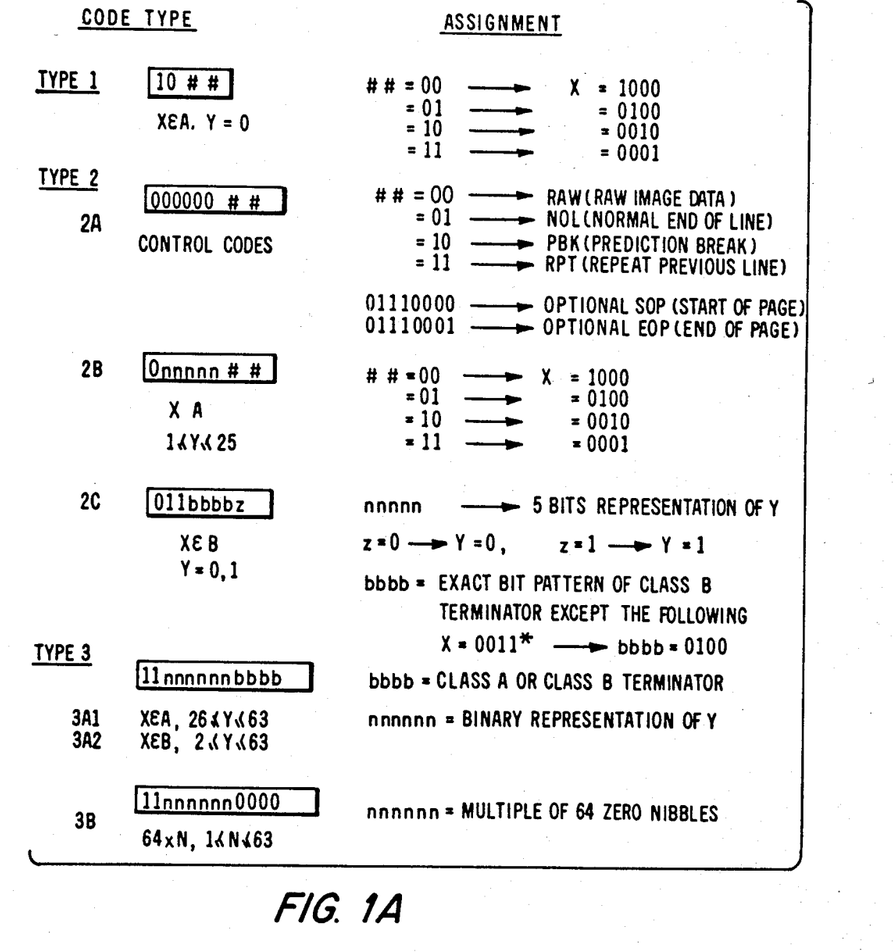
FIG. 1A is a code assignment.
Figure 1B:
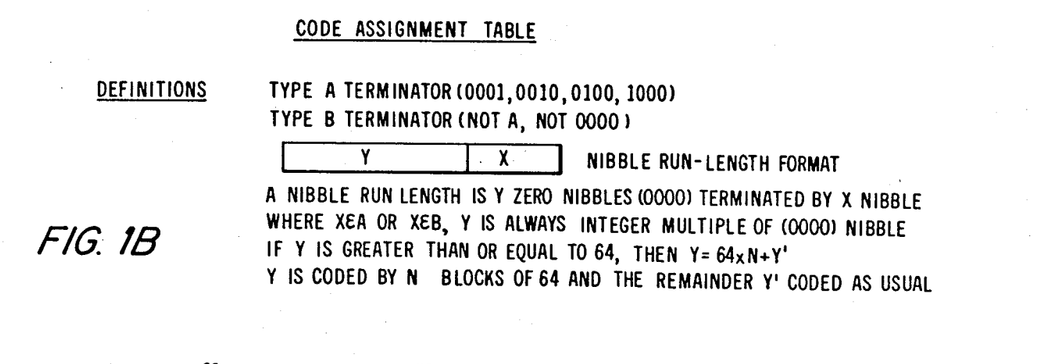
FIG. 1B is a set of definitions for the symbols used in FIG. 1A.
Figure 5:
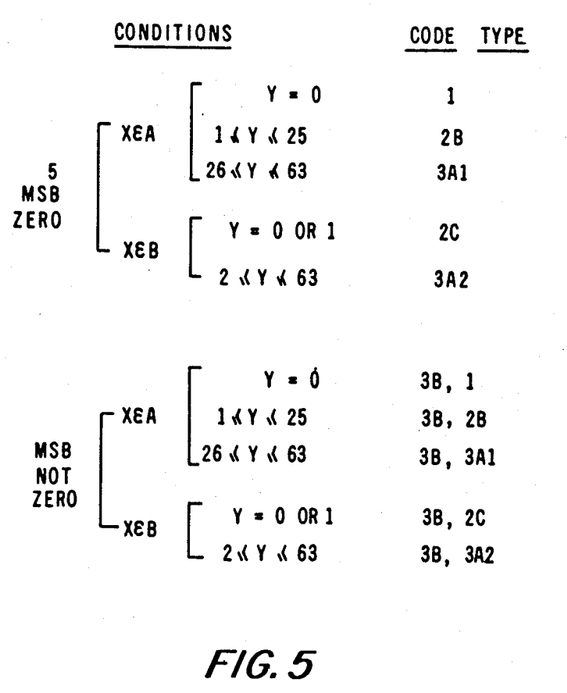
FIG. 5 is a decision tree showing the multiplexer sequencing.

In the particular embodiment described herein, the specific rules for converting an input data string into coded words are illustrated in FIGS. 1A and 1B, and summarized in FIG. 5. An input data string is defined as a series of Y all-zero nibbles followed by one terminating nibble X that contains at least one 1 bit. As shown, a Type 1 output word has four bits, a Type 2 output word has eight bits and a Type 3 output word has twelve bits.

A Type 1 output word is generated if there are no leading all-zero nibbles (Y=0) and the terminating non-zero nibble, X, belongs to the set of A, where A={1000, 0100, 0010, 0001}. If these conditions are satisfed (that is X$\epsilon$A, Y=0) then the output is in the form of 10## where the ## bits are assigned as shown in FIG. 1B.

If Y=0 or 1 and X is in the set of B, where the set of B is all four-bit combinations except A and all zeros, then a Type 2C output word will be produced. The output word will be in the form of 011bbbbZ where bbbb is the actual four bit pattern of the terminating nibble, except that bbbb=0100 when X=0011. Finally, Z=Y.

If $1 \leq Y \leq 25$ and X is in the set of A, a Type 2B word of the form 0nnnnn## will be reproduced, where nnnnn is the five bit representation of Y, and ## are assigned as shown.

If X is in the set of A and $26 \leq Y \leq 63$, or if X is in the set of B and $2 \leq Y \leq 63$, then a Type 3A output word is reproduced of the form 11nnnnnnbbbb where nnnnnn is the binary representation of Y and bbbb is the pattern of bits in the terminating nibble.

The above rules apply where there is a maximum of 63 all-zero nibbles before the terminating nibble. If there are 64 or more all-zero nibbles before a non-zero terminating nibble, the data string is converted into a first part comprising a number of sets of 64 all-zero nibbles and a second part comprising the remaining 0 to 63 all-zero nibbles and the terminating nibble. The first part is encoded into a Type 3B output word of the form 11nnnnnn000 where nnnnnn is the binary representation of the number of sets of 64 all-zero nibbles. The second set is then encoded according to the previously described rules.

Figure 2:
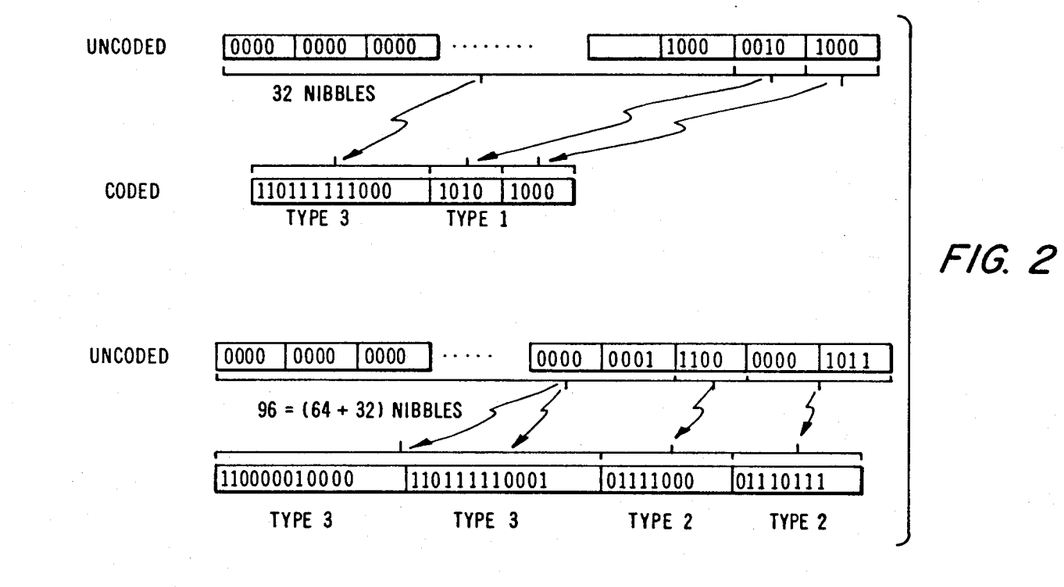
FIG. 2 comprises two examples of the encoding process.

These rules may be illustrated by way of the examples of FIG. 2. In Example 1, the first string comprises 31 all-zero nibbles and a terminating nibble of 1000. X$\epsilon$A and $26 \leq Y \leq 63$ so a Type 3A output word is called for. In this case, 11,nnnnnn,bbbb = 11,011111 (31 all-zero nibbles), 1000 (the actual bit pattern).

The next input word is 00100. Y=0 and X$\epsilon$A so a Type 1 word is required. In this case 10## = 1010.

The last input word is a 1000 which is also in the set of A so the Type 1 output word, 10##, becomes 1000 as shown.

In Example 2 of FIG. 2, the first input string has 94 zero nibbles and a terminating nibble of 0001 making a total of 96 nibbles. First the multiples of 64 zero nibbles are separated out. Here there is one group of 64 zero nibbles, so a Type 3B word is called for. 11nnnnnn0000 = 11,000001 (one set of 64 zero nibbles), 0000. Next, the remainder is encoded using the above described rules. There are 31 zero nibbles in the remainder and the termination nibble is of the set of A so a Type 3A output word will be produced. 11,nnnnnn,bbbb = 11,011111 (31 zero nibbles), 0001.

The next input word is 1100 which is in the set of B, and Y=0. A Type 2C word is required. 011,bbbb,Z = 011,1100 (the actual pattern), 0 (Y=0).

The final input word is 0000 1011. Here, Y=1 and the terminator is the set of the set of B so a Type 2C word is again required. 011,bbbb,Z = 011,1011 (the actual pattern), 1 (Y=1).

Figure 3:
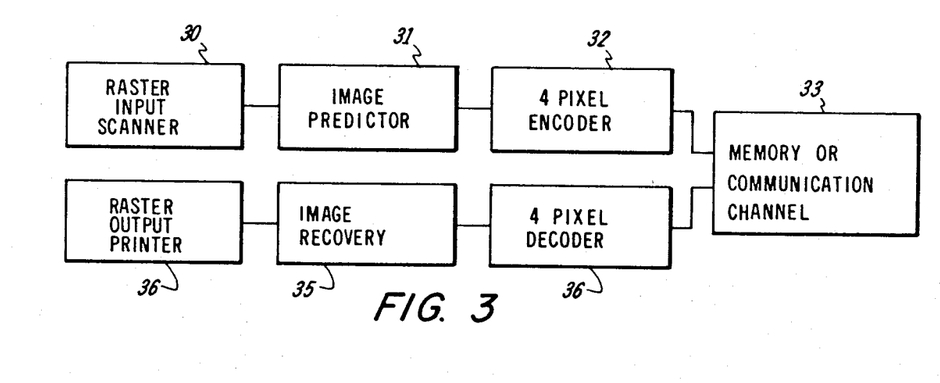
FIG. 3 is a block diagram of a system in which the invention may be used.

FIG. 3 is a simplified block diagram of a typical image processing system for reading an image in binary form into and back from a communication channel or memory storage device 33.

The document is scanned by a raster input scanner 30 which transforms each scanned line of image into a series of binary bits representing black and white pixels. The majority of bits output are white or 0 bits since the scanned document usually is text. Next, the predictor 31 operates on the bit string, usually reducing further the number of 1 bits. Finally, the bit string is encoded using the results stated above to compress the data prior to transmission or storage.

To read from the communication channel or memory 33 and print on paper, the reverse process is called for. A decoder 34 expands the coded words into bit strings, an image recovery circuit 35 or depredictor recreates the original bit string as it was produced by the raster input scanner 30, and the image is printed by the raster output printer 36.

Figure 4:
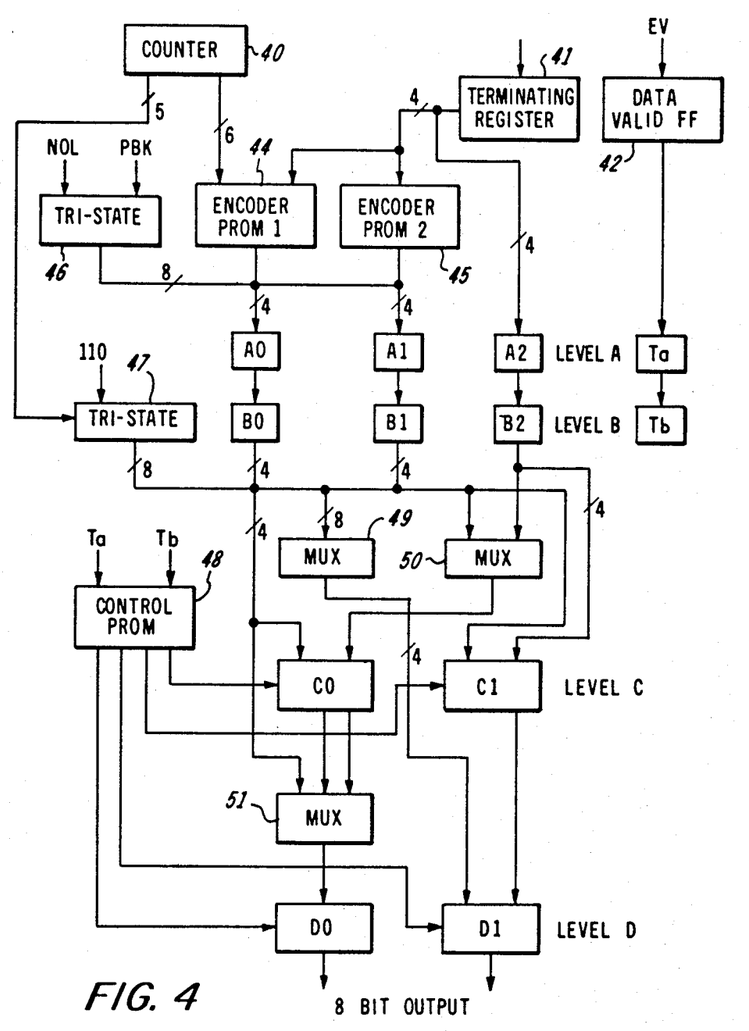
FIG. 4 is a block diagram of the encoding circuit.

FIG. 4 is a detailed block diagram of the circuit. The incoming image data, in the form of four bit nibbles, are input to the eleven bit run length counter 40 which increments for each all-zero nibble received. An eleven bit counter was chosen to accommodate the count of a complete scan line of all-zero nibbles corresponding to an all-white scan. The input is also received at the terminating register 41 which controls the remaining circuitry if the received nibble is a terminating nibble. An additional input is the error valid (EV) bit input to data valid flip-flop 42. The error valid line going high indicates that the accompanying data word is a non-zero terminating nibble from the predictor.

During scan line operation, if the predictor correctly predicted all four bits of the nibble, the error valid signal will be low and the counter 40 is incremented. If the predictor failed to predict one or more of the four bits correctly, the error valid signal will be high. In either case, the circuit will address 1K × 4 bit PROMs 44 and 45 with the contents of register 41 and the least significant six bits of counter 40. The result is that if a four bit output word is appropriate it will be contained in register A0; if an eight bit word is appropriate, it will be contained in registers A0 and A1; and if a twelve bit output word is appropriate, it will be contained in registers A0, A1 and A2.

In fact, registers A0, A1 and A2 will be loaded from PROMs 44 and 45 and register 41 whether the data is valid or not. The data will be valid if it was received with a high error valid bit. As the error data is shifted to "Level A", the error valid (EV) bit is shifted also, to flip-flop Ta, thus indicating that the Level A data is valid.

The control codes are also generated at Level A. For example, two control codes representing a normal end of line (NOL) and a predition break (PBK) may be multiplexed into registers A0 and A1 through tri-state devices 46 as shown.

During the same cycle, if there is a non-zero terminator and the count is more than sixty-four, the five most significant bits of the counter 40 and some leading code bits (110) may be coupled through the tri-state devices 47 and multiplexers 49, 50 and 51 into registers C0, C1, D0 and D1. Thus, the code words produced as the result of the reception of one terminating nibble may be clocked into various registers at Levels A, C and D. During succeeding clock times, this data is then shifted down through the four level pipeline to emerge as eight bit output words.

The process is controlled by PROM 48 which receives input bits indicating the size and location of the various code word segments and controls the multiplexers 40, 50 and 51 so that these segments are shifted through the pipeline properly.

The function of the pipeline elements is most easily demonstrated by a discussion of the worst case where register D0 contains data from a previous cycle, the instant input nibble produces a twelve bit Type 3B run length and a twelve bit Type 3A1 or 3A2 terminating code word, and where the subsequent code word produced is an eight bit Type 2 word. The circuit must produce and output these code words in the correct sequence, compacted into eight bit output words, without the loss of data.

During the first clock period the five most significant bits of the counter 40 and three leading code bits (110) are coupled through the tri-state devices 47 and multiplexer 49 and loaded into registers D1 and C0, and register C1 is zeroed, to produce a twelve bit Type 3B code word at Levels C and D.

At the same time a twelve bit Type 3A1 or 3A2 word is produced by the encoders 44, 45 and loaded into the A0, A1 and A2 registers.

During the second clock period the data in registers D0 and D1 is output, the C0 and C1 data is shifted into registers D0 and D1, the A0, A1 and A2 data is shifted into B0, B1 and B2 and a new code word is loaded into Level A. At this point, Levels A, B and D contain data.

During the third clock period the data in registers D0 and D1 is output, the data in B0 and B1 is shifted directly into D0 and D1, and thereafter data is shifted down the pipeline in a straight forward manner.

The control of this process is provided by the PROM 48 which receives data information from the Ta and Tb flip-flops and is coupled by control lines to registers C0, C1, D0 and D1 and to multiplexers 40, 50 and 51.

Figure 6A:
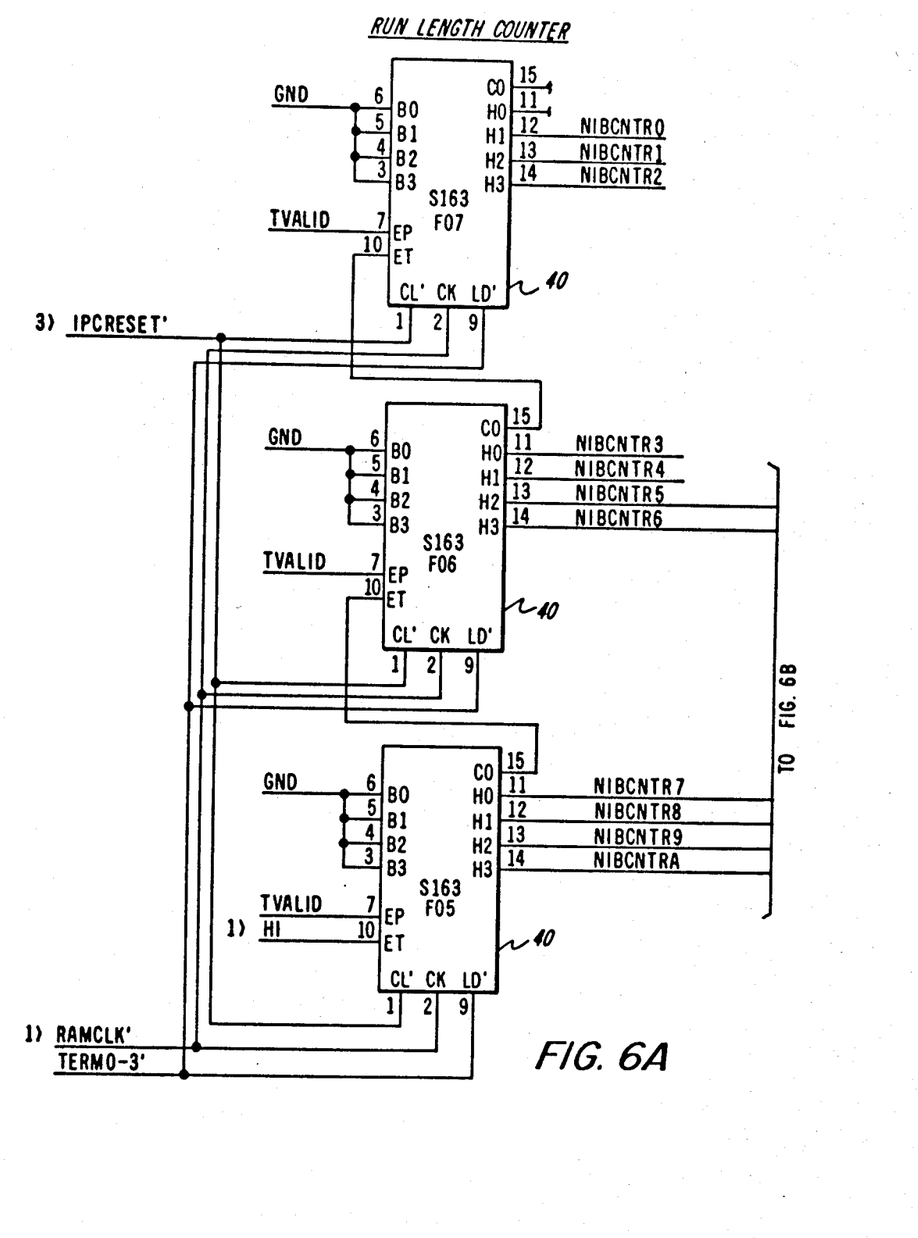
FIGS. 6 through 9 are schematic diagrams of the circuit.
Figure 6B:
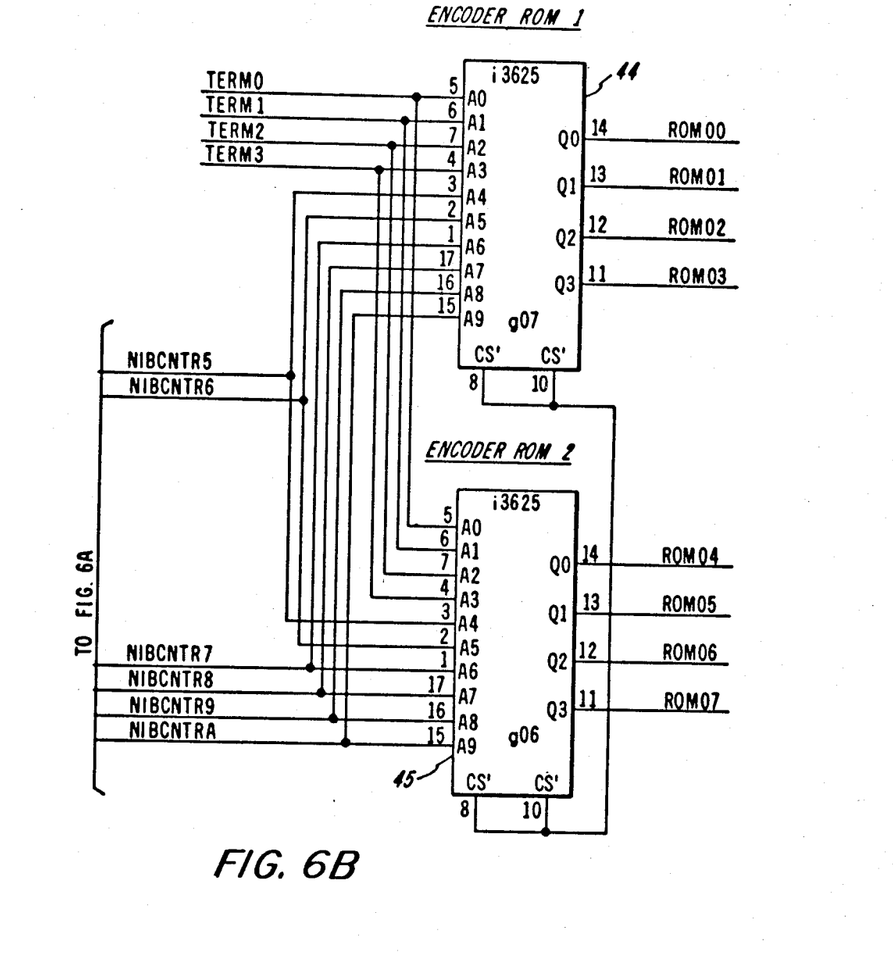
Figure 6C:
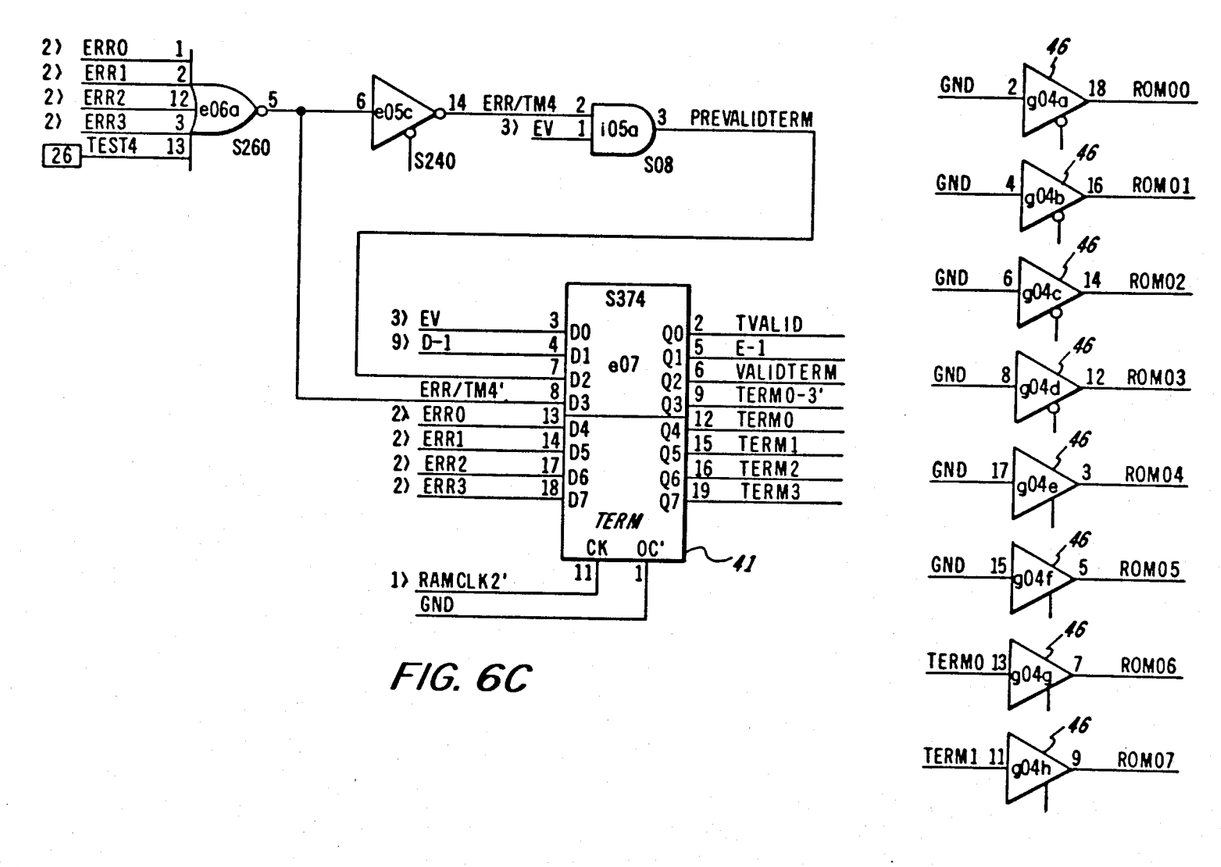

FIGS. 6, 7, 8 and 9 are detailed schematics of the circuit. In FIG. 6, counter devices f07, f06 and f05 comprise the eleven bit counter 40. The six least significant bits are connected as address inputs to ROM devices g07 and g06 which are the encoder PROMs 44, 45.

The terminator register 41 is the lower half of register device e07, and receives the four error inputs Err0-3 from the predictor, said inputs constituting the predicted image data word inputs to this circuit. The error valid signal, EV, is also buffered through this device e07. The error valid signal, EV, which is buffered through this device e07 represents the difference between the predicted and actual scanned data. The presence of predicted data at the input causes the "Data Valid" flip flop to be set.

FIG. 6 tri-state devices g04a through g04h are the tri-state devices 46 of FIG. 4 that may be used to inject control codes into the data stream. In the case shown, there is a capability for generating four control codes using the Term 0 and Term 1 lines.

Figure 7A:
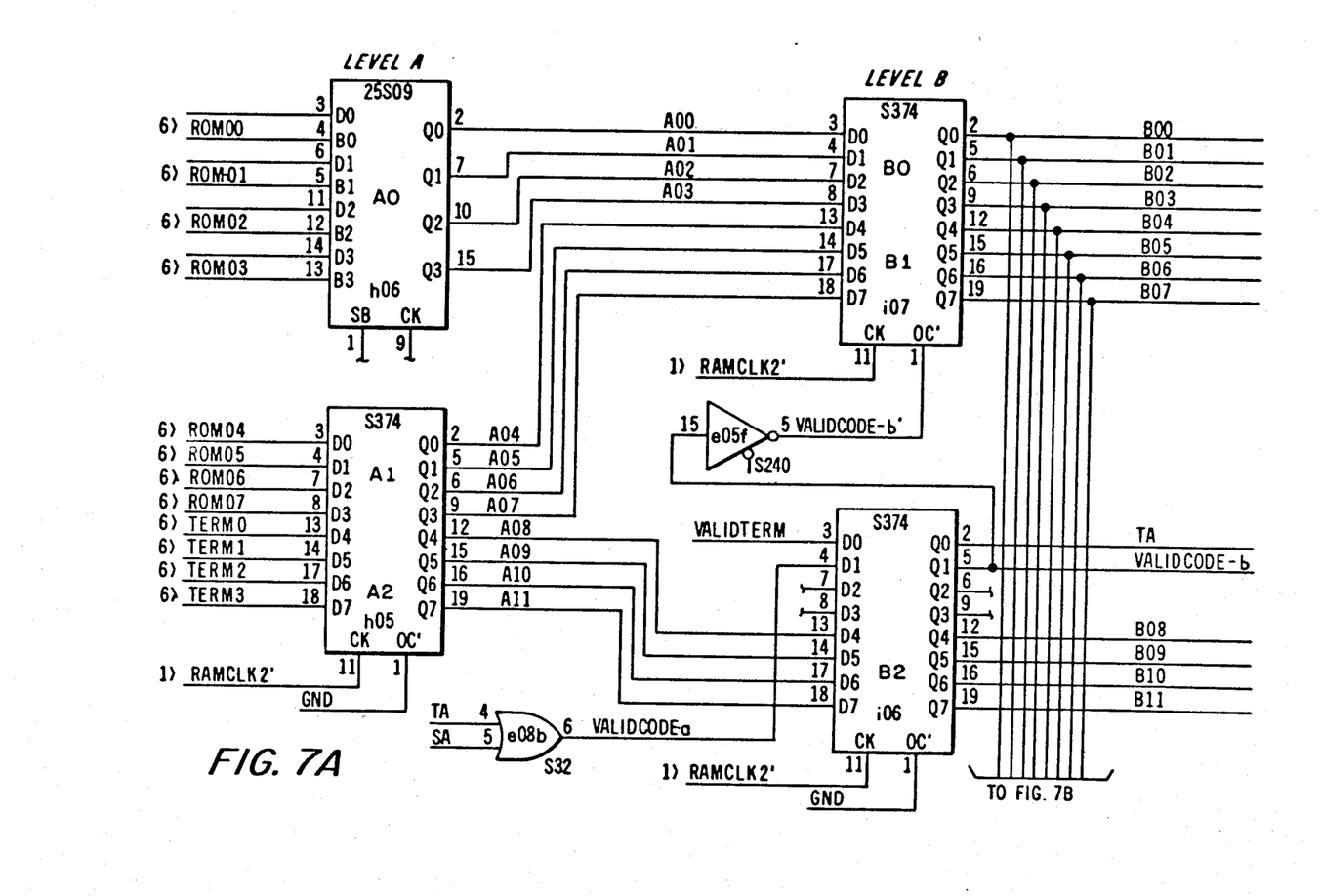
Figure 7B:
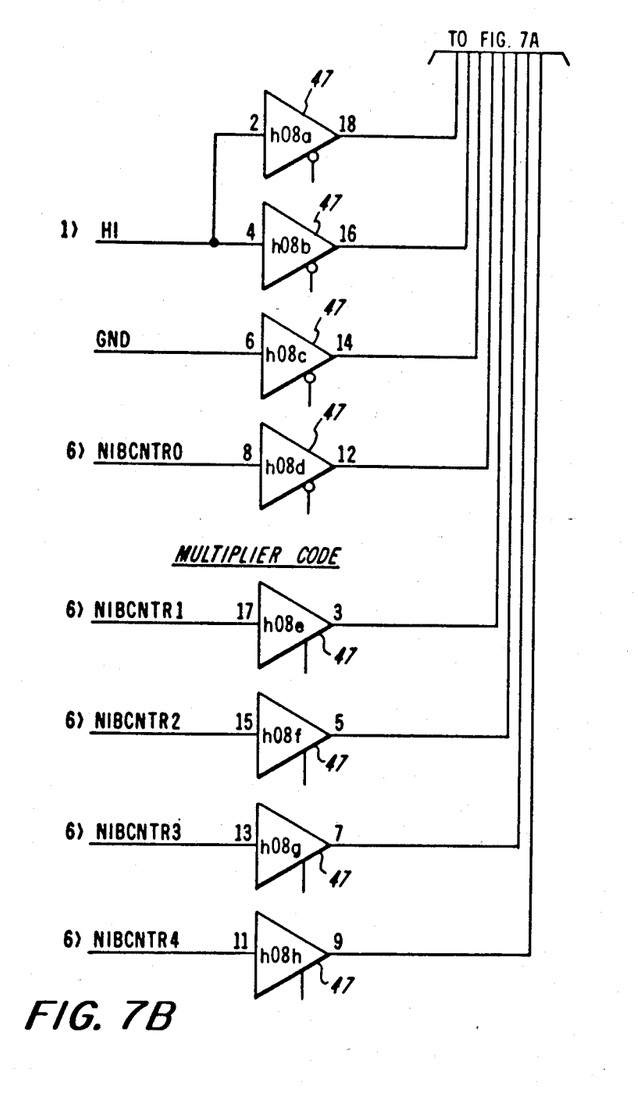

As shown in FIG. 7, the A0, A1 and A2 registers implemented from a multiplexer h06 and a register h05 receive twelve parallel bits of data on the ROM 00 through ROM 07 lines from ROM 1, 44 and ROM 2, 45 memory devices and on lines Term 0 through Term 3 from the terminating register 41. As described above, the next clock pulse will then transfer these twelve bits on lines A00 through A11 to the B0 and B1 registers i07 and B2 register i06.

The tri-state devices 47 of FIG. 4 are shown as devices h08a through h08h and couple the three leading bits (110) of the Type 3B code word and the five most significant counter 40 bits from lines NibCntr0 through NibCntr4 to the B0, B1 and B2 register output lines B00 through B11.

Figure 8A:
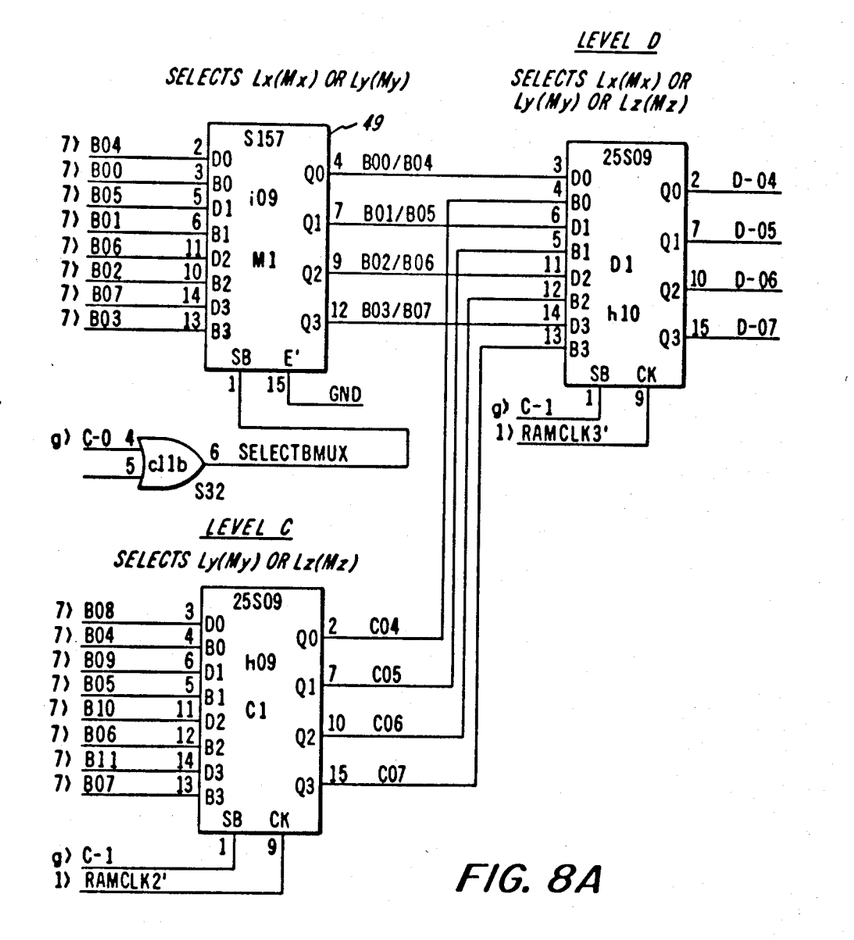
Figure 8B:
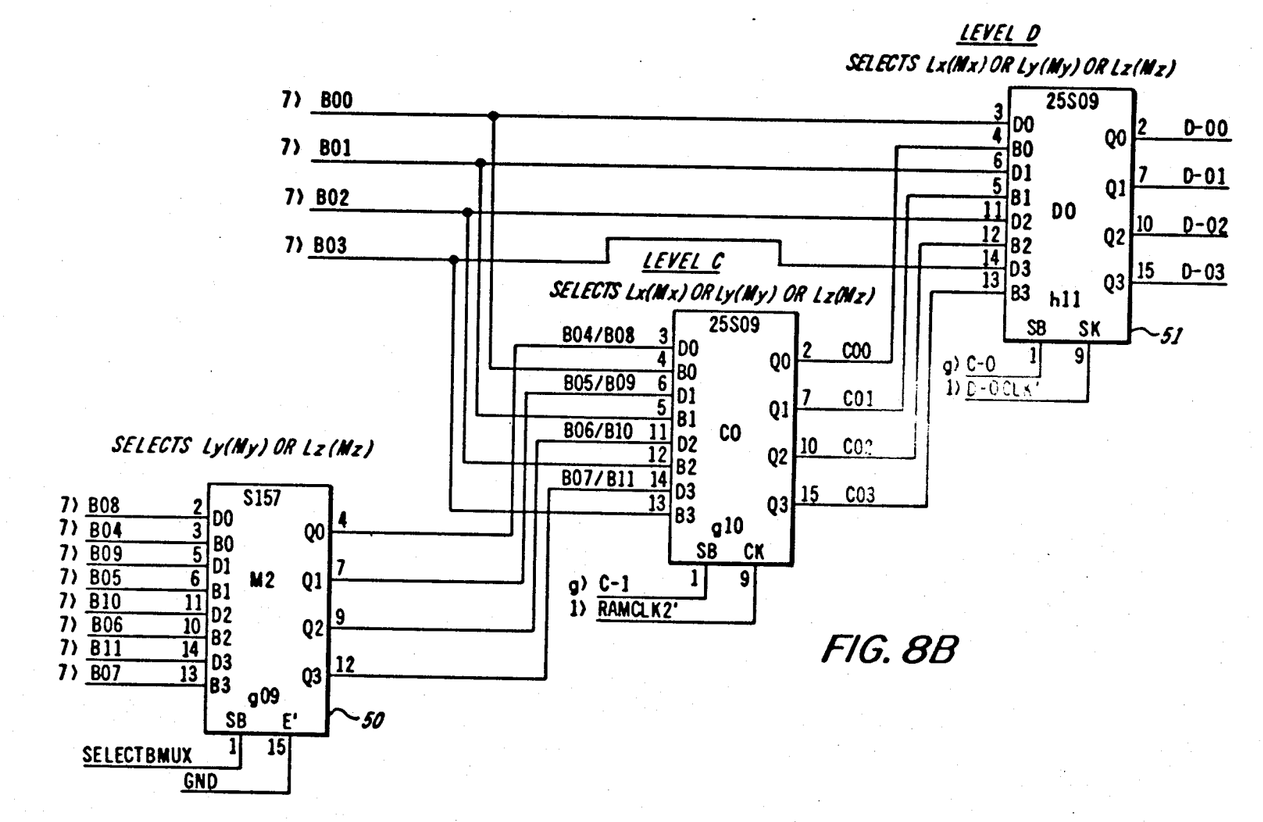

The C0 register, a multiplexing latch g10, is shown in FIG. 8 as receiving data from either the B0 register on lines B00 through B03 or through multiplexer 50 from either the B1 register on lines B04 through B07 or the B2 register on lines B08 through B11. The multiplexer 51 of FIG. 4 and the C0 register are combined into multiplexer/latch device h11 which is labeled as the D0 register, and which receives four bits of data from the B0 register on lines B00 through B03 or from the C0 register on lines C00 through C03.

The C1 register h09 is also a multiplexing latch receiving data from the B1 and B2 registers. Finally, the D1 register h10 receives either C1 register data through lines C04 through C07 or B0 and B1 register data through the M1 multiplexer 49 on lines B00 through B07.

Figure 9:
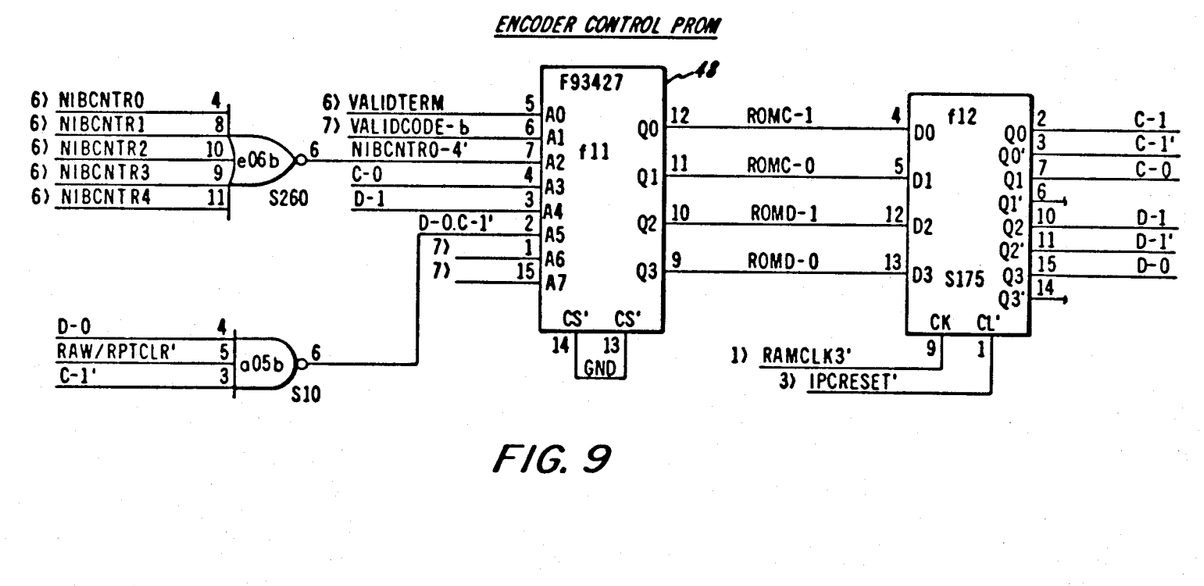

FIG. 9 is a schematic of the encoder PROM 48 circuit of FIG. 4. The NibCntro-4 signal line is driven by the output of gate e06b which monitors the five most significant bits of the counter 40 to signify whether more than 64 all-zero nibbles have been received and therefore whether a Type 3B code word need be produced. The Valid Term input is a result of the exclusive ORing of the four bits of the latest data input nibble and signifies whether the last nibble is all-zero. ValidCode-b is a function of the bit in the Ta register of FIG. 4 and signifies whether the data in the A Level registers during the previous clock period, and in the B Level registers during the current clock period, are valid. These inputs are used as inputs to the encoder control PROM 48 which drives a decoder f12 to produce control signals C-0, C-1, D-0 and D-1 which are used to control the M1 multiplexer 49, the M2 multiplexer 50 and the C0, C1, D0 and D1 registers of FIG. 8.

The invention is not limited to any of the embodiments described above, but all changes and modifications thereof not constituting departures from the spirit and scope of the invention are intended to be covered by the following claims.

I claim:

1. A method for the compression of serial binary data comprising the steps of:
   separating said serial data into bit nibbles,
   counting the run length of all-zero nibbles received prior to receiving a terminating nibble,
   converting the run length of all-zero nibbles into a first code word portion,
   converting the terminating nibble data pattern into a second code word portion, the more common terminating nibble data patterns being compressed into second code words of shorter length than the original data,
   generating a plurality of flag bits to identify the format of said code word, and
   combining the first and second code word portions and said flag bits into a code word a multiple of n bits long.

2. The method of claim 1 where n=4 and x=4.

3. The method of claim 2 wherein said more common terminating nibble data patterns are 1000, 0100, 0010 and 0001, and are compressed into 2 bit second code words.

4. The method of claim 2 wherein the more frequently occurring run lengths are assigned to shorter code words.

5. The method of claim 4 wherein any all-zero count which is too large to be convertable into a first code word portion is separated into a first run length which is convertable, and a second run length which is the remainder,
   said first run length being converted into a code word which contains only run length information, and
   said second run length and the terminating nibble being converted into an additional code word as described in claim 4.

6. The method of claim 5 wherein the first run length is 64, all code words are 4, 8 or 12 bits, and code word prefixes of one, two or three bits identify the length of the word.

7. The method of claim 6 wherein code word prefixes of 10, 0 and 11 identify code word lengths of 4, 8 and 12 bits, respectively.

8. The method of claim 6 wherein the four more common terminating nibble bit patterns are coded into 2 bit code word portions, and the remaining eleven patterns are embedded directly into an 8 or 12 bit code word to enable simple decoding.

9. The method of claim 5 wherein otherwise unused codes are used as control codes.

10. The method of claim 9 wherein six control codes are converted into 8 bit code words.

11. A method of run-length encoding and compression for converting input data into output code words, each a multiple of n bits in length, for use in an image processing system including means to raster scan a document to form raster scan lines of black and white pixels, each line represented as a series of n binary bit nibbles, the method of converting strings of said input data into a series of encoded words having a run-length and data pattern format, said conversion comprising the steps of:
 determining the run length of zero nibbles prior to receiving a terminating nibble,
 generating a first code word portion representative of said run length,
 generating a second code word portion representative of said terminating nibble, wherein said second code word portion may be a compressed representation of said terminating nibble,
 generating a plurality of flag bits to specify the format of said code word, and
 combining said first and second code word portions and said flag bits into composite code words, the bit lengths of which are multiple integers of n thereby permitting high data conversion rates of said input data.

12. The method of claim 11 including the step of compressing second code word portions comprising terminating nibbles of common occurrence by generating two bit second code word portions thereby producing shorter code words upon combining said first and second code word portions.

13. The method of claim 11 wherein n=4 and said multiple integers are 1, 2 and 3.

14. The method of claim 11 including the steps of separating out run lengths of said zero nibbles that are multiples of m, and
 generating a second type of code word indicative only of the run length thereof.

15. The method of claim 11 including the step of providing one, two or three bit code word prefixes indicative of the code word length.

16. The method of claim 14 including the step of providing code word prefixes indicative of the code word length, said code prefixes being 10, 0 and 11, identifying code word lengths of 4, 8 and 12 bits, respectively, where n is equal to 4 and m is equal to 64.

17. A method of compressing serial binary data into code words comprising the steps of:
 separating said serial data into 4 bit nibbles,
 incrementing the count of all-zero nibbles if the current nibble is all zeros,
 transmitting a code word if the current nibble is not all zeros, said code word being one of three types,
 a first type 4 bits in length wherein the leading two bits are code word identifiers and the second two bits identify four of sixteen possible nibble bit patterns,
 a second type 8 bits in length wherein the leading two or three bits are code word identifiers, two bits identify said four nibble patterns and the remaining bits are the all-zero nibble count, and
 a third type 8 or 12 bits in length wherein the leading two or three bits are code word identifiers, four bits are an exact representation of the current nibble bit pattern and the remaining bits are the all-zero nibble count, and
 zeroing the all-zero nibble count.

18. The method of claim 17 wherein said four identified bit patterns are 1000, 0100, 0010 and 0001.

19. The method of claim 17 further comprising a fourth type of code word 12 bits in length wherein the first one or several bits are code word identifiers and the remaining bits contain a representation of the all-zero nibble count, for use when the count is too large to be contained in any of the first three types of code words.

20. The method of claim 17 wherein a number of 8 bit codes are reserved as control codes.

* * * * *